United States Patent [19]

Lang

[11] Patent Number: 4,759,121

[45] Date of Patent: Jul. 26, 1988

[54] TEMPLATE GUIDE TRACKING DEVICE FOR PERFORMING PRECISE WORK OPERATIONS

[76] Inventor: Ueli Lang, 522 Shore Rd., Apt. 5A, Long Beach, N.Y. 11561

[21] Appl. No.: 63,970

[22] Filed: Jun. 19, 1987

[51] Int. Cl.$^4$ ............................................. B23Q 35/02
[52] U.S. Cl. ........................................ 29/701; 29/700
[58] Field of Search ......................... 29/700, 701, 714

[56] References Cited

U.S. PATENT DOCUMENTS 3,143,791  8/1964  Lanahan ........................ 29/701 X
3,523,353  8/1970  Drinkard et al. ................. 29/701

Primary Examiner—Howard N. Goldberg
Assistant Examiner—Taylor J. Ross
Attorney, Agent, or Firm—Martin Smolowitz

[57] ABSTRACT

A template guide tracking device useful for rapidly performing work functions such as joining together workpieces on a riveting machine. The template device has a tracking guide provided by a continuous groove having work stations provided at multiple intersection points located between adjacent segments of the groove. The groove may have a depth less than the template thickness with work stations being provided by openings extending through the template, or alternatively the groove may extend entirely through the template and have the work stations each provided by an enlarged opening or laterally located notch at the intersection point between adjacent segments of the groove. The template device track member may be movably attached to a baseplate member by dual sets of linear bearings, and the baseplate is directly attached to a frame member of a product assembly machine such as a riveting machine, and provides a rapid and reliable means and method for successive work operations such as workpiece fastening operations.

11 Claims, 3 Drawing Sheets

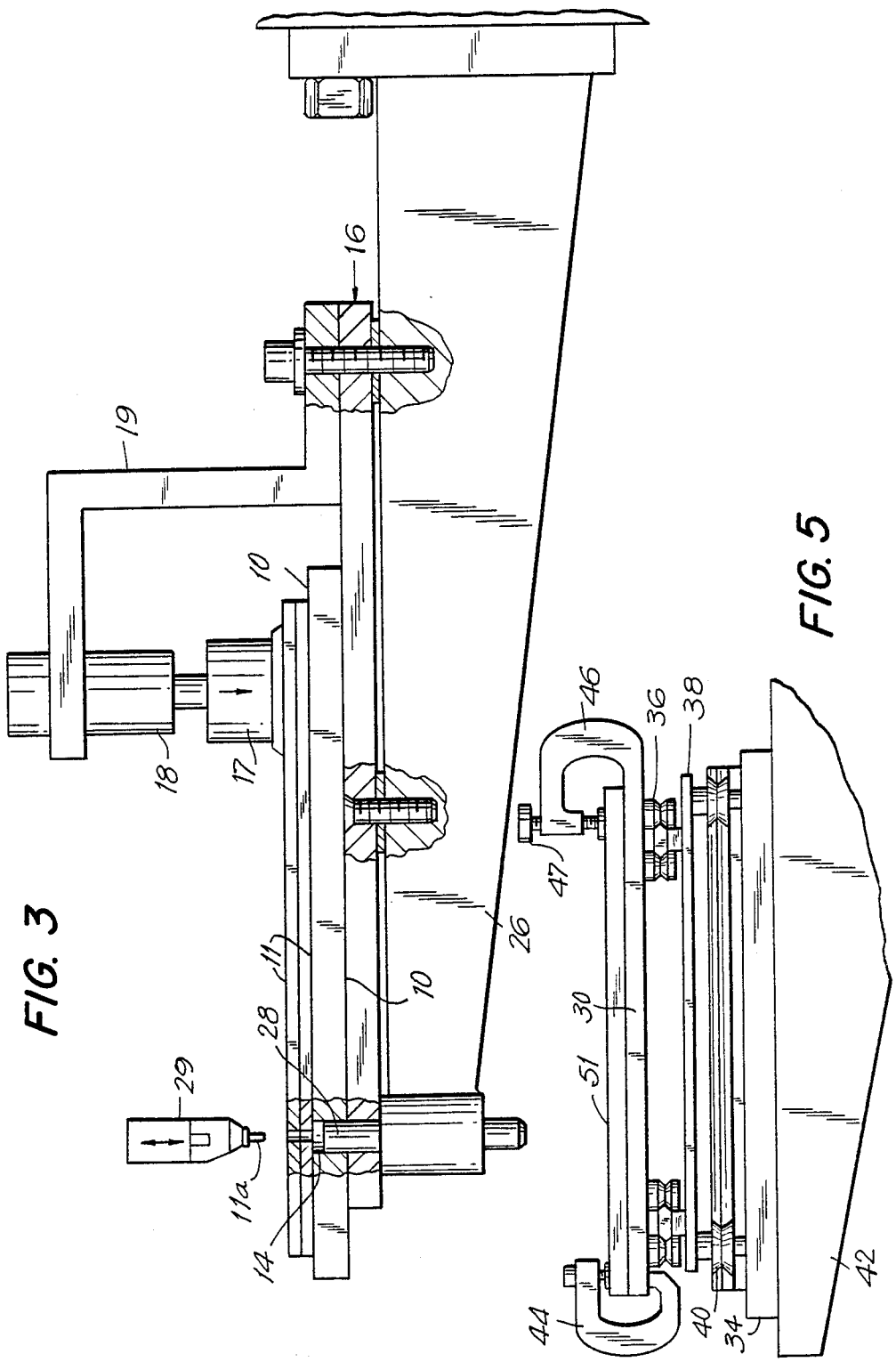

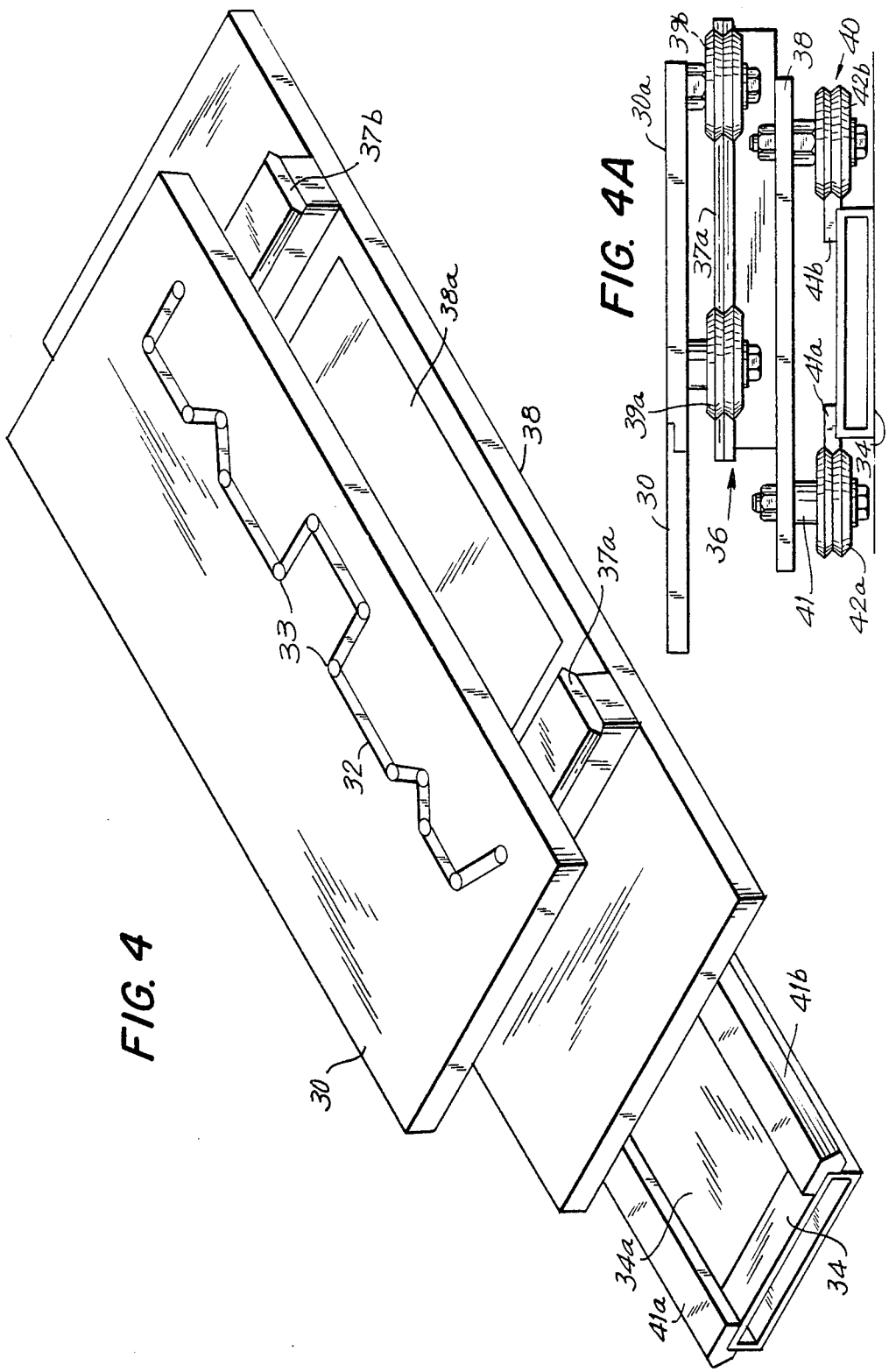

TEMPLATE GUIDE TRACKING DEVICE FOR PERFORMING PRECISE WORK OPERATIONS

BACKGROUND OF INVENTION

This invention relates to template guides used to facilitate performing precise work operations on production machines. It relates particularly to a template guide tracking device adapted for attachment to various production machine and to a method for rapid location of work operations such as fasteners for joining work pieces.

Templates of various types are widely used in industry to facilitate the production and assembly of various parts. For example, U.S. Pat. No. 3,131,464 to Wiegel discloses a template having a plurality of index openings used with a pantagraph device for locating connector parts. U.S. Pat. No. 3,295,189 to Hammell discloses an arrangement for terminal board wiring using a card to assist an operator in identifying terminal posts to which wires are to be connected. U.S. Pat. No. 3,641,651 to Rockwell, Jr. et al discloses a machine for successively positioning a workpiece such as a circuit board in predetermined relation to a tool such as an inserter using a program provided by a template relative to a sensor in combination with dual open plates, with lateral movement of the template being controlled by drive motors. Also, U.S. Pat. No. 4,510,667 to Nassoy et al discloses a method and apparatus for presetting mounting holes for cutting and ejection tools in a platen press, and utilizing a template for providing a pattern of holes for positioning a cutting form and an ejection board for cutting paper box blanks.

Although the prior art has disclosed various template arrangements, it has apparently not provided a template guide tracking device adapted for convenient and rapid use to facilitate performing successive work operations, such as use for rapidly fastening workpieces using joining machines such as rivet machines. The present invention was developed after extensive effort and provides an engineered template guide device having improved accuracy and speed for performing various workpiece operations, such as for successive precision blind riveting operations.

SUMMARY OF INVENTION

This invention provides an improved template guide tracking device adapted for accurate and rapid location of successive work functions, such as locating fasteners for joining together workpieces by a mechanical fastening or joining machine. The template guide device includes a template track member having a continuous locating groove provided therein, which groove connects together at least three and usually 5-50 or more work stations provided at the intersection points between adjacent segments of the continuous locating groove, as determined by the requirements of a particular work product being produced. The template guide device continuous groove may have a depth less than the template track member thickness, with the work stations being provided at the intersections of adjacent segments by lateral locating means consisting of openings extending through the template. Alternatively, the continuous groove may extend entirely through the template track member with the work stations lateral locating means being each provided by an enlarged opening in the groove at the groove segment intersection points, or by a laterally extending notch provided adjacent the groove segment intersection points. The groove and openings therein provide a guidance means for rapid and precise location of successive work functions or operations, such as for riveting, glueing, stapling or spot welding operations performed on workpieces attached to the template.

The template track member is movably supported on a base member so as to provide for easy lateral movement of the template and attached workpiece as needed for a particular groove and work station configuration. The template preferably has the track member supported on a baseplate by dual sets of linear bearing units, with each dual bearing unit set being disposed at right angles to each other, so as to provide for ease of lateral and/or transverse movements of the template track upper member relative to the baseplate member. This arrangement permits easy movement of the template guide track member manually in any direction parallel to the baseplate member as determined by a work sequence for a particular workpiece. Although the template guide device of this invention is usually used when oriented in a horizontal position, the provision of dual linear bearings located between the template track member and the base member permits the template device to be inclined at an angle up to 90° with the horizontal plane. For horizontally oriented templates, movable support for the template track member can alternatively be provided by suitable magnetic or pneumatic support means used in combination with suitable movement limiting means or stops.

The template groove segments are made sufficiently deep and wide to provide a reliable guidance means relative to a guide member, thereby permitting an operator to quickly locate successive work operations, such as work piece fasteners at desired work stations prior to setting the fasteners, such as for accurately locating a workpiece relative to an anvil of a riveting machine for rivets to be inserted in the workpiece. The groove dimensions should be at least about 0.030 in. deep and 0.060 in. wide to provide reliable guidance for the template. For groove depths less than the template thickness, useful groove dimensions are 0.035–0.125 in. deep and 0.065–0.250 in. wide, with the template thickness being at least about 0.180 in. and not exceeding about 0.300 in. thick. The cross-sectional shape of the groove can be semicircular, triangular or rectangular, with a rectangular shape being preferred for its greater reliability for guidance. Alternatively if desired, the continuous guide groove can extend entirely through the template track member, and have the work stations lateral location means provided as an enlarged opening or provided as laterally extended notches located adjacent the points of intersection between the adjacent groove segments. Although for small size templates the indexing movement to successive work stations can be performed manually, for large and heavier templates the template indexing may be performed mechanically such as by suitable pneumatic or robotic actuator devices.

The present invention also includes a method or procedure for utilizing the template guide tracking device for accurately and rapidly performing multiple work functions, such as for locating multiple fasteners such as rivets provided in a workpiece mounted on a riveting machine. In the method, a workpiece is firmly attached to the template tracking member so that the anvil of the riveting machine extends at least partly into the guide groove and also extends through the guide groove at the work stations located at the groove segment intersection points, so that the fixed anvil serves as a locating pin in the template guide track. The template and attached workpiece are moved while being guided by the groove in the template until an index point is reached, which point is provided by a lateral locating means provided in the template guide groove for determining the correct location(s) of fasteners for the part(s) to be attached together. After each rivet is accurately set in the workpiece, the template is moved to the succeeding work stations or rivet set points and the action repeated until all rivets have been properly set in the workpiece(s).

The present invention advantageously provides an engineered template guide device and method for performing work operations, such as for accurate and rapid blind riveting operations. The template guide tracking device can be conveniently and economically used with only minor adaptations on a wide range of standard or commercially available joining machines, such as for glueing, stapling or spot welding machines. Other useful application or work functions for the template guide device include non-fastening work operations, such as precise decorative embossing, engraving, routing, sand blasting and screen printing. The template guide tracking member can be moved relative to the baseplate member either manually or moved by suitable machanical actuator devices.

BRIEF DESCRIPTION OF DRAWINGS

The invention will be further described with reference to the following drawings, in which:

FIG. 3 shows an elevational sectional view of one embodiment of the template guide device clamped onto a frame support of a riveting machine;

FIG. 4 shows a perspective view of another embodiment of a template guide device including dual linear bearing sets located at right angles to each other so as to facilitate lateral and transverse movements of the template track member relative to a baseplate member;

FIG. 4A shows an end elevation view of the template guide device of FIG. 4; and

FIG. 5 shows an elevation view of the template guide device of FIG. 4 attached onto a riveting machine frame support structure for fastening together mating work pieces.

DESCRIPTION OF INVENTION

Figure 1:
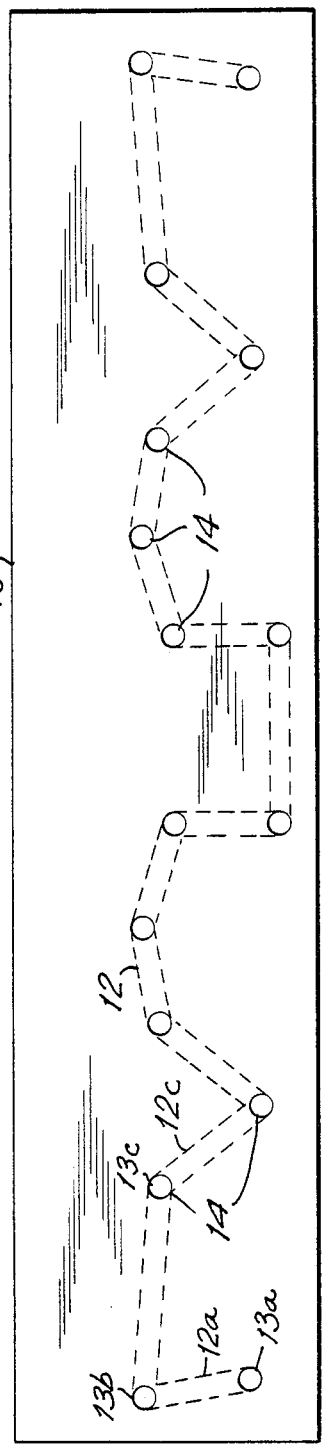
FIG. 1 shows a plan view of a typical template guide track member having a continuous groove pattern and work station location means provided therein according to the present invention with only the work station locating means extending through the template.

In one embodiment of the invention as shown by FIG. 1, a template guide track member 10 is provided having a continuous guide groove 12. The guide groove 12 has a depth less than the template thickness, and includes intersecting segments 12a, 12b, 12c, etc., which connect together a plurality of desired work locations or stations 13a, 13b, 13c, etc, provided at the intersection points of adjacent groove segments. The work stations are provided by openings 14 extending through the template 10, such as work stations used for locating fastener rivets in a workpiece. The template 10 has thickness of 0.18–0.30 inch, and guide groove 12 provided on the lower or rear side of the template has a depth of at least about 0.030 in. and preferably 0.035–0.125 in. depth, and has a width of at least about 0.060 in. and preferably 0.065–0.250 in. wide, so as to permit an operator to rapidly and reliably move the template guide to a plurality of connected successive work stations 13a, 13b, etc. as provided by openings 14 extending through the template at the groove segment intersection points. At each work station fasteners such as rivets may be installed into a workpiece rigidly attached to the template member 10. The template track member 10 is made of a lightweight dimensionally stable material, such as aluminum, brass, or a molded plastic material such as polystyrene, polyvinylchloride or similar material.

Figure 2:
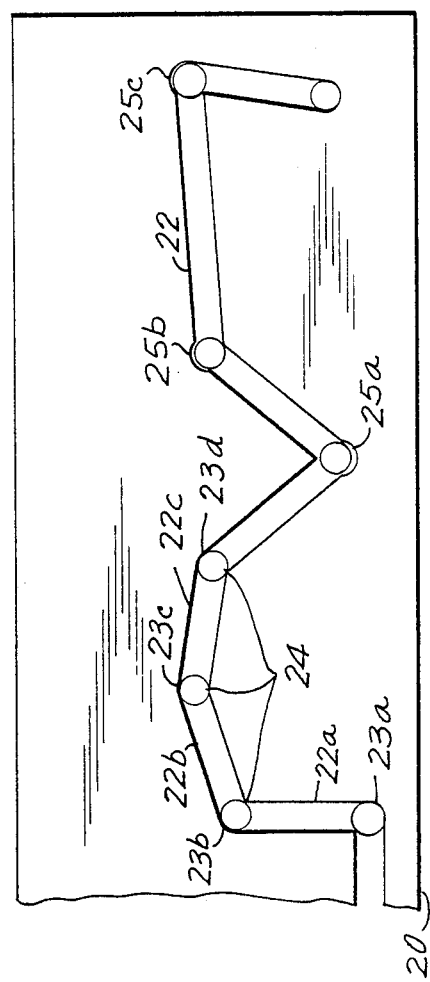
FIG. 2 shows a portion of an alternative template guide track member in which the continuous groove and work station locations both extend through the template track member.

In an alternative embodiment of the invention, a template track member 20 shown by FIG. 2 was a guide groove 22 which extends entirely through the template and each intersection of adjacent groove segments 22a, 22b, 22c, etc., is provided with a lateral location means such as a hole 24 located at the intersection of the adjacent groove segments, so as to provide accurate location for the fastener means relative to the workpiece mating parts. Alternatively, the work station locating means can be provided by a laterally extended notch 25a, 25b, 25c, etc., located adjacent to each intersection point of the adjacent groove segments. Each such locating notch has a radius equal to one half the width of groove 22, and is moved laterally from the points of intersection of adjacent groove segments by a distance sufficient to provide a definite work station location equal to 0.3–1.0 times the width of the groove 22, as generally shown by FIG. 2.

In one a useful embodiment of the invention as shown by FIG. 3, the template 10 and a workpiece 11 are each placed over a carrying baseplate 16 of a riveting machine frame support member 26. The template 10 and workpiece 11 are held firmly in relative positions by a clamping means 17, including a spring-loaded device 18 attached to machine bracket 19. The anvil guide member 28 of the riveting machine frame support member 26 extends through openings 14 provided at each intersection position 13a, 13b, etc., between the adjacent segments of the continuous groove 12. Alternatively, the anvil member 28 can extend through continuous groove 22 and openings 24 in the template 20. Rivet punch 29 descends intermittently to set rivets 11a in the workpiece(s) 11.

Another useful and preferred embodiment of this invention is shown by FIG. 4, in which template guide track member 30 is provided with a continuous guide track 32 which connects together a plurality of work stations 33 and which extend entirely through the template 30, similarly as for template 20 in FIG. 2. The template track member 30 is movably disposed over a baseplate member 34 by at least two sets of linear bearings 36 and 40 disposed at right angles to each other, each bearing set consisting of dual parallel linear bearing units provided on two different but parallel planes, as shown in elevation end view by FIG. 4A.

Bearing set 36 includes dual slide plates 37a and 37b attached to outer sides of center plate 38. Dual roller bearing units 39a and 39b are attached to the underside of the template track member 30 and each contact the parallel edges of each slide plate 37a and 37b respectively, to provide accurate alignment and support for the template 30. Similarly, bearing set 40 includes dual slide plates 41a and 41b attached along the outer edge of baseplate 34, and dual roller bearing units 42a and 42b are attached to the underside of centerplate 38 and each contacts the parallel edges of each slide plate 41a and 41b. The central portion of baseplate 34 and centerplate 38 each have large central openings 34a and 38a provided therein to permit a stationary probe member such as the anvil member 28 of a riveting machine to enter and follow the continuous groove 32 of template member 30. Accurate lateral spacing between each pair of the dual parallel linear bearings 36 and 40 is provided by a rotatable eccentric pin 41 extending through one of the bearings of each pair, which pin can be rotated to provide a cam action to secure a proper snug fit between the roller bearing pair and the mating slide plates, as is shown in greater detail by FIG. 4A. Linear bearings suitable for this template guide device include Dual Vee or Hepco slide systems available from Bishop-Wisecarver Corp., Pittsburgh, Calif.

As an alternative arrangement shown by FIG. 4A, the template track member 30 can be attached to a front longitudinal edge of an auxiliary template support member 30a, which is movably supported by the dual linear bearings sets 36 and 40.

The template guide member 30 is further shown in elevation view by FIG. 5, in which the baseplate member 34 is mounted onto a carrying or support structure 42 of a riveting machine (not shown). One or more workpieces 51 on which successive work functions are to be performed are rigidly attached to the template track member 30 upper surface by suitable clamping means. The clamp means can be provided by dual removable clamps 44, such as in the form of conventional adjustable C-clamps, or a clamp means 46 can be affixed to opposite ends of the template track member 30 with each clamp having a threaded screw 47 adapted for rigidly clamping the workpiece 51 onto the template track member. Dual linear bearing sets 36 and 40 are provided between the upper template track member 30 and baseplate member 34.

The present invention also includes a method or procedure for using the template tracking guide device constructed according to the invention. In the procedure, the workpieces 11 to be attached together such as by riveting are removably attached onto the template 10 which is provided with a guide groove 12, as shown in FIGS. 1 and 2. The template continuous guide groove connects all desired points of rivet placement in successive order, and the operator rapidly moves the template 10 laterally with the stationary machine anvil member being inserted in the groove 12, until all points of rivet placement are traversed and all desired rivets have been set into the workpiece(s). The template guide pattern and movements have no specific order other than utilizing as much as possible the shortest distance from one rivet location to the next location. Random placement of rivets with template movements to left, right, forward, backward, or rotary directions are all possible. There is no limit as to how many rivets can be set in one loading operation, with at least 3 rivet locations being provided and preferably 5–50 rivet locations being provided.

The template track member is advantageously moved quickly and successively from one precise point to another without the need of close visual measurement to maintain accuracy of the rivet location. This arrangement eliminates guesswork and time consuming efforts to achieve proper alignment of blind rivet locations. This method also prevents inaccuracies due to part-creep occurring, so that precision in rivet location is achieved without special craftsman-type skills by the operator. The method also minimizes waste of raw materials and undesired double-handling of parts. The system is also designed to provide optimal safety features and is simple to operate.

The invention will be further described by the following examples of a template guide device, which should not be construed as limiting in scope.

EXAMPLE 1

A template guide device similar to FIG. 1 includes a track member movably supported by a lower plate and has a continuous groove in the track member. The template device is removably attached directly to a support platform member of a rivet machine similarly as shown in FIG. 3. The rigid anvil member of the rivet machine extends upwardly into the continuous guide groove in the template member and extends through locating openings in the template at each work station therein. Pertinent dimensions for the template device and fasteners are as follows:

Template length, in.: 24
Template width, in.: 12
Template thickness, in.: 0.20
Groove depth, in.: 0.10
Groove width, in.: 0.20
Template opening diameter, in.: 0.20
Rivet diameter, in.: 0.125
No. of work station rivet locations in template: 12

The template member is rapidly moved laterally relative to the baseplate member and anvil location to the successive work station locations for precise placement of rivets in the workpiece.

EXAMPLE 2

In another embodiment of the invention, a template track member similar to the FIG. 2 configuration is provided. The template device has an upper track member movably attached to a baseplate member by Hepco dual linear type bearings provided by Bishop-Wisecarver Corp. The upper plate has a continuous guide groove which extends entirely through the template, and is provided at each segment intersection point with an opening which is offset from the intersection point by a distance equal to 0.4–0.6 times the groove width. The template device is removably attached onto a platform of a riveting machine, so that the rigid anvil of the rivet machine extends through the continuous groove of the template track member. Pertinent dimensions for the template device are as follows:

Template length, in.: 36
Template width, in.: 16
Template member thickness, in.: 0.25
Groove width, in.: 0.25
Template notch diameter, in.: 0.25
Template notch offset dimension, in.: 0.125

During use the template track member is moved rapidly laterally relative to the baseplate member and the stationary anvil location of a rivet machine to successive locations as needed for precise location and placement of rivets in the workpiece(s).

Although this invention has been disclosed broadly and in terms of specific embodiments, it will be apparent that modification and variations can be made and some elements used without others, all as defined by the following claims.

I claim:

1. A template guide tracking device for providing accurate and rapid location of work stations, comprising:
   (a) a template track member having a continuous groove provided therein, said groove defining at least three work stations located at adjacent intersecting segments of the groove, said groove being at least about 0.030 inch deep and 0.060 inch wide, said work stations being provided by openings extending through the template track member, said template track member being made movable in both lateral and transverse directions relative to an adjacent baseplate member;
   (b) clamping means for removably attaching a workpiece onto said template track member; and
   (c) means for removably attaching said template track member and baseplate member directly onto a frame support member of a work machine having a guide member contacting said groove, whereby multiple work stations can be accurately located at the template groove intersections for convenient and rapid work operations on the workpiece.

2. A template guide tracking device according to claim 1, wherein the template track member has thickness of 0.200–0.300 inch, the continuous groove is made 0.035–0.10 inch deep and 0.065–0.250 inch wide, and said continuous groove is provided with 5–50 work stations formed by openings through the template track member and at which fasteners can be accurately located in a work piece.

3. A template guide tracking device according to claim 1, wherein the continuous groove extends entirely through the template member and the work station locations are provided by an enlargement located at the intersection of the adjacent segments.

4. A template guide tracking device according to claim 1, wherein the continuous groove extends entirely through the template track member and the work locations are provided by laterally extended notches provided adjacent the groove segment intersection points.

5. A template guide tracking device according to claim 1, wherein said template track member is movably attached to the baseplate member by dual sets of linear bearing elements which are arranged in two parallel planes for providing the lateral and transverse movements of the template track member relative to the baseplate.

6. A template guide tracking device according to claim 1, wherein said template track member and an attached workpiece are removably attached together with said baseplate onto a frame support member of a riveting machine, so that multiple rivets can be located in the workpiece at the work stations located at intersection points of the adjacent groove segments.

7. A template guide tracking device according to claim 5, wherein spacing between the linear bearing sets and a mating slide plate are made adjustable by eccentric journal means associated with each set of bearings.

8. A template guide tracking device adapted for providing accurate and rapid location of workpiece fasteners, comprising:
   (a) a template track member having a continuous groove provided on its lower side and defining 5–50 work stations located at intersection points of adjacent segments of the continuous groove, said groove having a depth of 0.035–0.100 inch and width of 0.065–0.250 inch;
   (b) dual linear bearing means connecting said template track member onto a baseplate member so that the template track member is movable in both lateral and transverse directions relative to the baseplate member; and
   (c) clamping means for removably attaching said baseplate member directly into position on a frame member of a riveting machine, whereby the template track member can be moved laterally relative to the baseplate member and an anvil of the riveting machine and multiple rivet fasteners can be accurately located at work stations located by the template groove intersection points for convenient and rapid attachment of workpiece parts together on the riveting machine.

9. A method for remotely locating a plurality of fasteners in a workpiece, comprising the steps of:
   (a) placing a template guide device having a continuous groove and a plurality of work station locations onto a workpiece joining machine, so that a stationary anvil member of the joining machine extends at least into the continuous groove and through an opening located at intersection points of adjacent segments of the groove;
   (b) providing at least one workpiece having at least three work station locations on the template guide, and moving a track member of the template guide device laterally and transversely so that the anvil member follows the groove to each successive work station; and
   (c) attaching a fastener element to the workpiece.

10. The fastening method of claim 9, wherein at least two workpieces being joined together are located above the template guide track member and the work stations are located by openings which extend through the track member.

11. The fastening method of claim 9, wherein the template guide is moved laterally at each work station into a notch located laterally adjacent the groove segment intersection points.

* * * * *